(12) United States Patent
Sommervogel et al.

(10) Patent No.: US 10,048,309 B2
(45) Date of Patent: Aug. 14, 2018

(54) METHOD AND DEVICE FOR AUTOMATICALLY MEASURING PHYSICAL CHARACTERISTICS OF A CABLE, IN PARTICULAR THE PROPAGATION VELOCITY

(75) Inventors: Laurent Sommervogel, Jouy-en-Josas (FR); Josy Cohen, Le Plessis Trevise (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1009 days.

(21) Appl. No.: 13/822,269

(22) PCT Filed: Sep. 8, 2011

(86) PCT No.: PCT/EP2011/065568
§ 371 (c)(1),
(2), (4) Date: Mar. 11, 2013

(87) PCT Pub. No.: WO2012/032125
PCT Pub. Date: Mar. 15, 2012

(65) Prior Publication Data
US 2013/0173187 A1   Jul. 4, 2013

(30) Foreign Application Priority Data
Sep. 10, 2010   (FR) ..................... 10 57189

(51) Int. Cl.
*G01R 31/08*   (2006.01)
*G01R 31/11*   (2006.01)
*G01R 31/02*   (2006.01)

(52) U.S. Cl.
CPC ........... *G01R 31/088* (2013.01); *G01R 31/11* (2013.01); *G01R 31/021* (2013.01)

(58) Field of Classification Search
CPC ...................................................... G01R 31/11
See application file for complete search history.

(56) References Cited

U.S. PATENT DOCUMENTS

| 3,753,086 A | | 8/1973 | Shoemaker, Jr. |
| 3,991,364 A | * | 11/1976 | Wiznerowicz ......... G01R 31/11 |
| | | | 324/533 |

(Continued)

FOREIGN PATENT DOCUMENTS

| DE | 947497 | 8/1956 | |
| DE | 19546455 C1 * | 5/1997 | ............... G01B 7/02 |

(Continued)

*Primary Examiner* — Kyle R Quigley
(74) *Attorney, Agent, or Firm* — Baker & Hostetler LLP

(57) ABSTRACT

A method for automatically measuring physical characteristics of a cable, comprises at least the following steps: positioning on said cable of means for creating an artificial singularity; the injection, at a point of said cable, of an electrical test signal; acquisition of said signal reflected on the singularities that said cable includes so as to produce a first reflectogram; measurement, on said reflectogram, of the temporal position Δt of the peak of the signal derived from its reflection on said artificial singularity; determination of the propagation velocity $v_p = 2x/\Delta t$ of the signal in said cable from the temporal position Δt and from the position x of said means for creating an artificial singularity on the cable.

9 Claims, 4 Drawing Sheets

(56) References Cited

U.S. PATENT DOCUMENTS

| | | | | |
|---|---|---|---|---|
| 4,597,183 | A | * | 7/1986 | Broding .................. G01S 13/88 |
| | | | | 324/206 |
| 4,887,041 | A | * | 12/1989 | Mashikian ............. G01R 31/11 |
| | | | | 324/533 |
| 5,128,619 | A | * | 7/1992 | Bjork .................. G01R 31/021 |
| | | | | 324/533 |
| 2004/0145377 | A1 | * | 7/2004 | Sherrard ............... G01F 23/284 |
| | | | | 324/644 |
| 2004/0153264 | A1 | * | 8/2004 | Teich ..................... G01R 31/11 |
| | | | | 702/65 |
| 2010/0045968 | A1 | | 2/2010 | Sikora |
| 2010/0164505 | A1 | * | 7/2010 | Breed .................. G01R 31/021 |
| | | | | 324/207.13 |

FOREIGN PATENT DOCUMENTS

DE           19839677 C1     4/2000
JP            63193077 A      8/1988

\* cited by examiner

METHOD AND DEVICE FOR AUTOMATICALLY MEASURING PHYSICAL CHARACTERISTICS OF A CABLE, IN PARTICULAR THE PROPAGATION VELOCITY

CROSS-REFERENCE TO RELATED APPLICATIONS

This application is a National Stage of International patent application PCT/EP2011/065568,filed on Sep. 8, 2011, which claims priority to foreign French patent application No. FR 1057189,filed on Sep. 10, 2010,the disclosures of which are incorporated by reference in their entirety.

FIELD OF THE INVENTION

The invention relates to a method and a device for measuring physical characteristics of a cable. It relates firstly to the measurement of the propagation velocity on a cable but also the determination of its length and the attenuation of an electromagnetic wave being propagated in such a cable.

BACKGROUND

The invention applies to any type of electrical cable, in particular power transmission cables or communication cables, in fixed or mobile installations. The cables concerned may be coaxial, two-wire, parallel pairs, twisted pairs or other, provided that it is possible to generate, at any point of the cable, a measurable singularity.

A singularity in a cable corresponds to a change in the signal propagation conditions in this cable. Most commonly it results from a fault which locally affects the characteristic impedance of the cable by inducing a discontinuity in its per-unit-length parameters.

To characterize an electrical cable, it is important to know the propagation velocity of a signal in this cable. In particular, an accurate measurement of this velocity is necessary when seeking to diagnose faults on a cable. The fault detection is done, as is known, by injecting a high-frequency signal which is propagated along the cable and is reflected on each of its singularities. From the knowledge of the delay between the various reflections, the faults can be accurately located. However, to convert duration into distance, it is necessary to accurately know the propagation velocity of the signal. The measurement of this velocity must be possible at any instant in order in particular to take account of its variation over time associated with the aging of the cable, or with a modification of the mechanical stresses which can be exerted thereon, such as pulling, twisting or even winding.

Solutions are known for determining the propagation velocity by mathematical and/or physical models and an estimation of the primary parameters of the cable. These solutions suffer from inaccuracy and above all do not take into account the aging of the cable and the trend of the velocity over time.

Other methods, called reflectometry methods, use instruments that are costly, bulky and cannot be carried around, which also suffer from not allowing the measurements to be updated over the life of the cable.

The American patent application US 2010/0045968 describes an alternative method for a non-intrusive measurement of the propagation velocity in a cable as well as of its length from optical beams projected in the transverse direction of the cable and analyzed by two optical sensors.

SUMMARY OF THE INVENTION

The aim of the present invention is to allow for a measurement of the propagation velocity of a cable by a method that is non-intrusive and suited to monitor the trend of the velocity over time. Another objective of the invention is to implement a device which offers a limited bulk in order to be used in mobile applications. Finally, the aim of the invention is also to measure characteristic parameters of an electrical cable such as its length and the attenuation of a signal being propagated in this cable.

To this end, the subject of the invention is a method for measuring physical characteristics of a cable, characterized in that it comprises at least the following steps:
  the positioning on said cable of means for creating an artificial singularity,
  the injection, at a point of said cable, of an electrical test signal,
  the acquisition of said signal reflected on the singularities that said cable includes so as to produce a first reflectogram,
  the measurement, on said reflectogram, of the temporal position $\Delta t$ of the peak of the signal deriving from its reflection on said artificial singularity,
  the determination of the propagation velocity $v_p = 2x/\Delta t$ of the signal in said cable from the temporal position $\Delta t$ and from the position x of said means for creating an artificial singularity on the cable.

In a variant embodiment of the invention, the temporal position $\Delta t$ is measured in relation to the first temporal peak of the reflectogram and the position x is measured in relation to the point of injection.

In a variant embodiment, the method according to the invention also comprises the following steps:
  the shifting of said means for creating an artificial singularity by a distance d on the cable,
  a second injection of said electrical test signal at said point of injection,
  the acquisition of said signal reflected on the singularities that said cable includes so as to produce a second reflectogram,
  the subtraction of said first and second reflectograms in order to produce a third reflectogram,
the temporal position $\Delta t$ being measured between the two peaks of highest amplitude of the third reflectogram and the position x being taken equal to d.

In a variant embodiment of the invention, the means for creating an artificial singularity consist of at least one of the following elements: a metal ring, a ferromagnetic loop, a cable-clamping tray or a ring consisting, in the longitudinal direction, of an alternation of metal and of insulator.

In a variant embodiment of the invention, the reflectograms are processed by an algorithm for increasing the signal-to-noise ratio.

In a variant embodiment, the invention also comprises a step of measuring the length of the cable from the measurement of propagation velocity $v_p$ and from the delay $\Delta t'$ between the first and the last signal peaks of the first reflectogram.

In a variant embodiment of the invention, the injected test signal is a temporal pulse or a signal with controlled spectral mask.

In a variant embodiment, the method according to the invention also comprises a step of measuring the attenuation a of the signal through the cable using the following relationship $$\alpha = -20\log\sqrt{\frac{\Gamma'}{1-\Gamma^2}},$$

with $\Gamma$ being the amplitude of the first peak of the first reflectogram, associated with the point of injection of the signal and $\Gamma'$ being the amplitude of the last peak of the first reflectogram associated with the end of the cable.

Another subject of the invention is a device for measuring physical characteristics of a cable comprising at least one device for injecting a test signal, a device for acquiring the test signal reflected on the singularities of the cable, means for creating an artificial singularity positioned on said cable and a device for post-processing said reflected signal, said measurement device being suitable for implementing the steps of the method according to the invention.

In a variant embodiment of the invention, the injection device and the acquisition device are jointly implemented by a waveform generator or an oscilloscope or a vector network analyzer or an electronic circuit board.

BRIEF DESCRIPTION OF THE DRAWINGS

Other features will become apparent on reading the following detailed description given as a nonlimiting example and in light of the appended drawings which represent.

DETAILED DESCRIPTION

Figure 1:
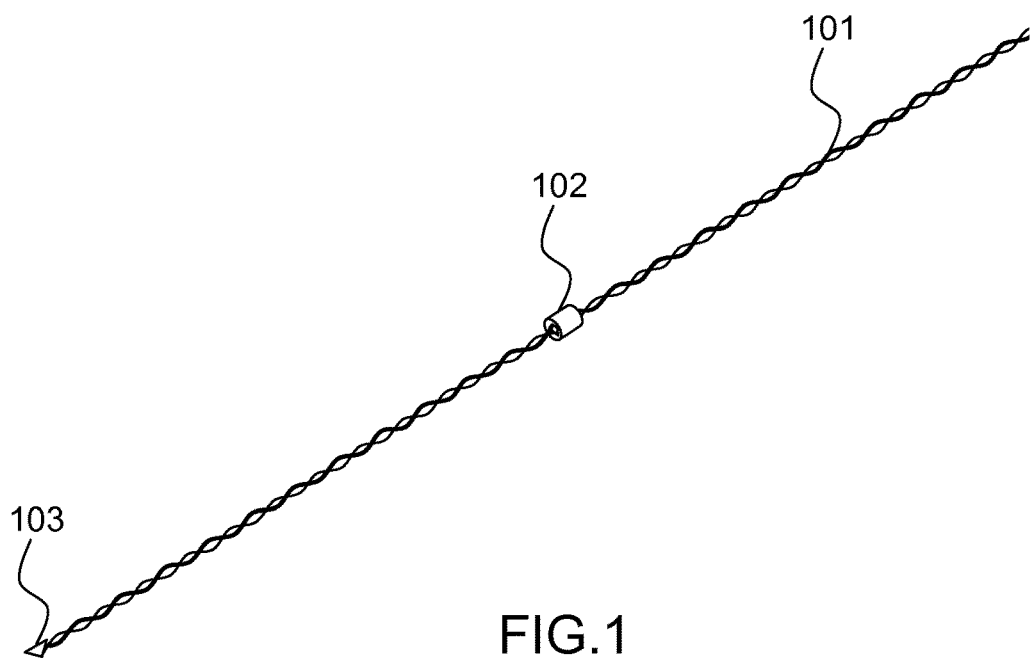
FIG. 1, a diagram illustrating the implementation of the method according to the invention, FIG. 2, an exemplary reflectogram obtained in an ideal case, in the absence of disturbances, FIG. 3, an illustration of the device according to the invention, FIG. 4, an exemplary reflectogram obtained in a real case, FIG. 5, the reflectogram obtained from the invention in the case of a singularity generated at a distance of 17 cm from the point of injection, FIG. 6, the reflectogram obtained from the invention in the case of a singularity generated at a distance of 51 cm from the point of injection, FIG. 7, the reflectogram obtained in a variant embodiment of the invention.

FIG. 1 illustrates the implementation of the method according to the invention making it possible to determine the propagation velocity on an electric cable 101. At least one end of this cable must be accessible to an operator. An element 102, for example a metal ring, is positioned at any location along the cable in order to artificially create a singularity. This element 102 may be, but not only, a metal ring, a ferromagnetic loop, a cable-clamping tray or any other means making it possible to locally modify the characteristic impedance of the transmission line formed by the cable. The element 102 is external to the cable, temporary and reversible, it is positioned on the cable only for the implementation of the method according to the invention and has to be able to be removed thereafter. The positioning of this element 102 is non-intrusive. Hereinafter in the description, the term ring will be used to designate this element 102. At the end 103 of the cable, a known signal is injected by signal generation and injection means into a cable. They are associated with means for acquiring the signal reflected on the singularities of the cable. Said acquisition means are capable of producing a temporal reflectogram of the injected signal. As a nonlimiting example, the following devices can be used either as injection means, or as acquisition means or even executing both functions jointly: a waveform generator, an oscilloscope, a vector network analyzer or even an electronic circuit board based on FPGA or DSP architecture, on which are implemented the processing operations to be executed. The injected signal is a high-frequency signal having known characteristics. It is, for example, a temporal pulse of small width. If constraints linked to electromagnetic compatibility (EMC) of the cable's environment exist, a compliant waveform with controlled spectral mask is injected. The incident wave resulting from this injection will encounter the ring 102 in its propagation and will then generate an echo on the acquisition device which stores the temporal reflectogram obtained as a consequence. This echo is linked to the singularity created by the ring 102 at a distance x from the point of injection 103. In a variant embodiment of the invention, the reflectogram obtained is subjected to one or more cleaning algorithms, the aim of which is two-fold. On the one hand, such an algorithm makes it possible to find the impulse response of the injected signal; on the other hand it also makes it possible to increase the signal-to-noise ratio. Such algorithms consist, for example, in an averaging, a suitable filtering, a simple deconvolution algorithm or an iterative FISTA algorithm (Fast Iterative Shrinkage Thresholding Algorithm). In a first embodiment of the invention, the distance x between the point of injection 103 and the ring 102 is known. In this case, the analysis of the reflectogram obtained by the acquisition device makes it possible to determine the propagation velocity $v_p$ as illustrated by FIG. 2.

Figure 2:
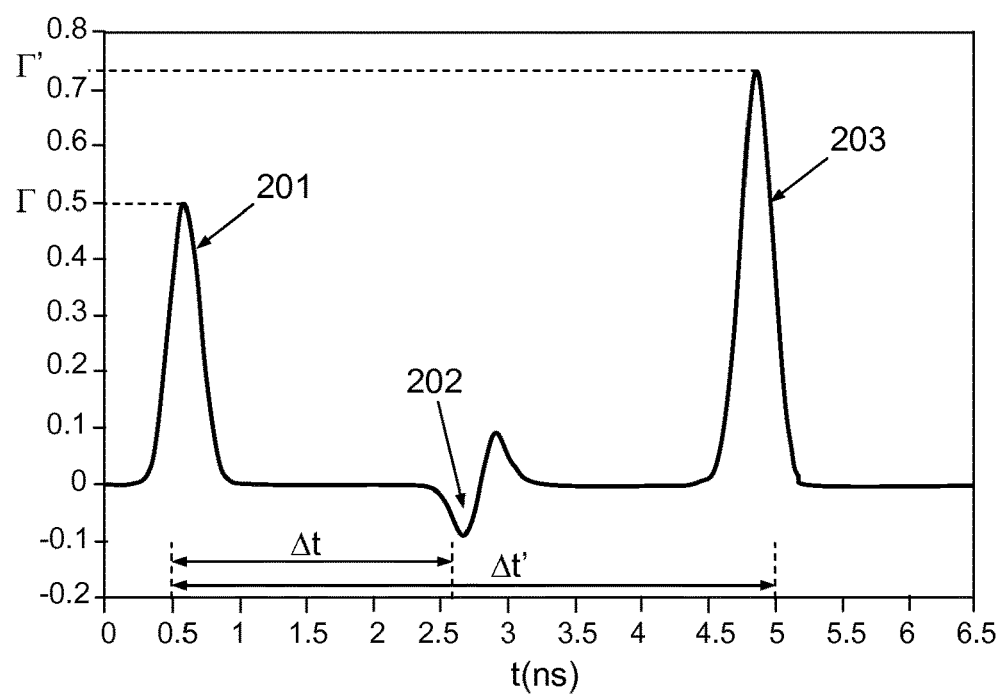

FIG. 2 shows an exemplary reflectogram according to the invention obtained in an ideal case for which no disturbance or noise affect the measurements. This reflectogram comprises a first peak 201 which corresponds to the point of injection of the signal which is here a temporal pulse. The last peak 203 corresponds to the end of the cable. The second peak 202 corresponds to the singularity generated by the ring 102. If the sampling frequency of the signal is sufficiently high, the peak 202 can be split. It consists in this case of a peak of negative amplitude followed by a peak of positive amplitude which correspond respectively to the mismatching generated by the first edge of the ring and that created by the last edge of the ring which has a certain width. If the sampling frequency of the signal is low, the two successive peaks are merged together. The reflectogram obtained makes it possible to determine the delays of the different reflections of the injected signal on the singularities encountered on the line. Thus, the delay $\Delta t$ measured between the point of injection and the second peak encountered makes it possible to work back directly to the propagation velocity by the following relationship:

$$v_p = \frac{2x}{\Delta t}.$$

In a real case, the signal transmitted along the cable is subject to various disturbances which can result in secondary noise peaks on the reflectogram. The peaks 201, 202, 203 containing the required information have to be identified and differentiated from the secondary noise peaks. In particular, the second and last peaks 202, 203 are the two peaks of the highest amplitude appearing on the reflectogram after the first peak 201.

The propagation velocity information obtained $v_p$ also makes it possible to deduce the length of the cable therefrom. In practice, the last measured peak 203 corresponds to the reflection of the signal on the terminal end of the cable. The measurement of the delay Δt' between the peak corresponding to the point of injection and that associated with the end of the cable makes it possible to deduce the length L of the cable therefrom by the following relationship:

$$L = v_p \frac{\Delta t'}{2}.$$

Finally, the amplitude Γ of the first peak also makes it possible to determine the characteristic impedance $Z_c$ of the line using the following relationship:

$$Z_c = Z_0 \frac{1+\Gamma}{1-\Gamma},$$

in which $Z_0$ is the output impedance of the measurement device.

Figure 3:
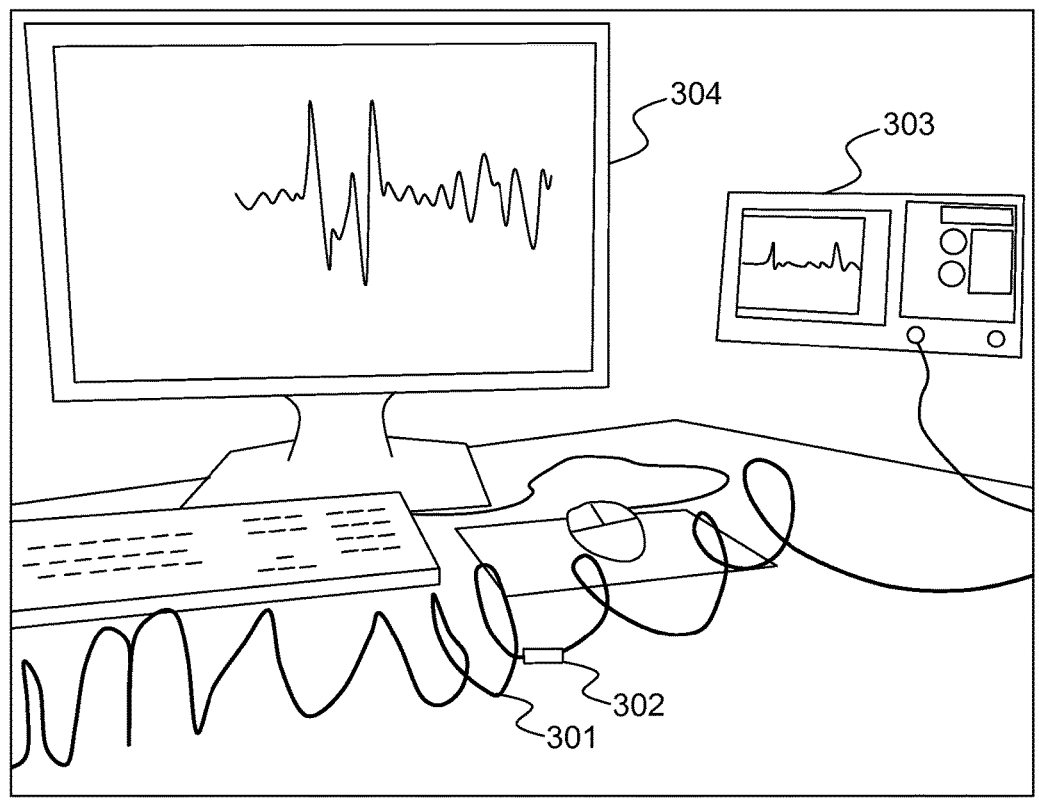

FIG. 3 schematically represents the device according to the invention which comprises, in addition to the ring 302 positioned on the cable 301, means for injecting and acquiring a signal 303 and a post-processing unit 304 which produces, from the reflectogram(s) produced by the acquisition means 303, a measurement of the physical characteristics of the cable, in particular its propagation velocity and its length.

In a variant embodiment of the invention in which the distance x is not known, the method according to the invention comprises the following additional steps. The operator shifts the ring 102 by a known distance d so that it is situated at a distance x+d from the point of injection. A second reflectogram corresponding to this second created singularity is determined. The two reflectograms obtained are substrated in order on the one hand to measure the temporal deviation Δt" between the two peaks associated with the two successive positions of the ring and on the other hand to eliminate the spurious peaks possibly linked to other uncontrolled singularities. Finally, the propagation velocity is obtained using the following relationship $$v_p = \frac{2d}{\Delta t''}.$$

Figure 4:
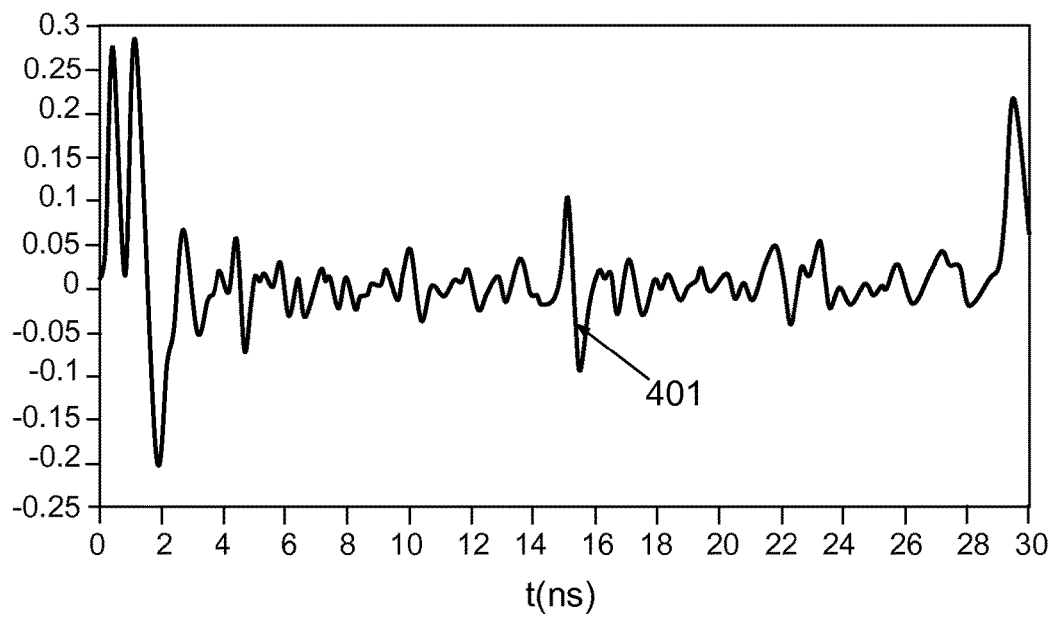

FIGS. 4 to 7 illustrate the implementation of the method according to the invention for the case of the abovementioned variant embodiment. FIG. 4 represents a reference reflectogram obtained from a temporal reflectometry method applied to an electrical cable. Compared to the ideal case described in FIG. 2, this reflectogram comprises, on the one hand, disturbances of random noise type which create numerous temporal peaks but of low amplitudes and, on the other hand, a peak 401 of higher amplitude corresponding to an electrical fault. Such faults can disrupt the measurements performed when they correspond to singularities generating, on the reflected signal, a peak of amplitude equivalent to that resulting from the singularity created artificially by the introduction of the metal ring. In such a case, it becomes impossible to distinguish, on the temporal reflectogram, the amplitude peaks associated with unprovoked singularities (electrical faults) from that induced by the positioning of a means for artificially creating a singularity.

Figure 5:
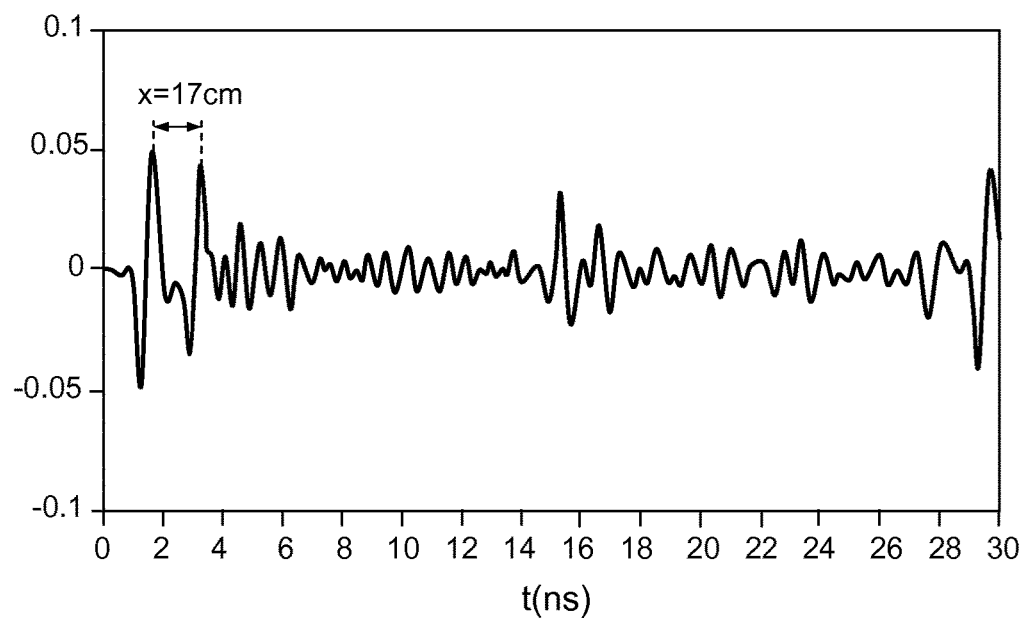
Figure 6:
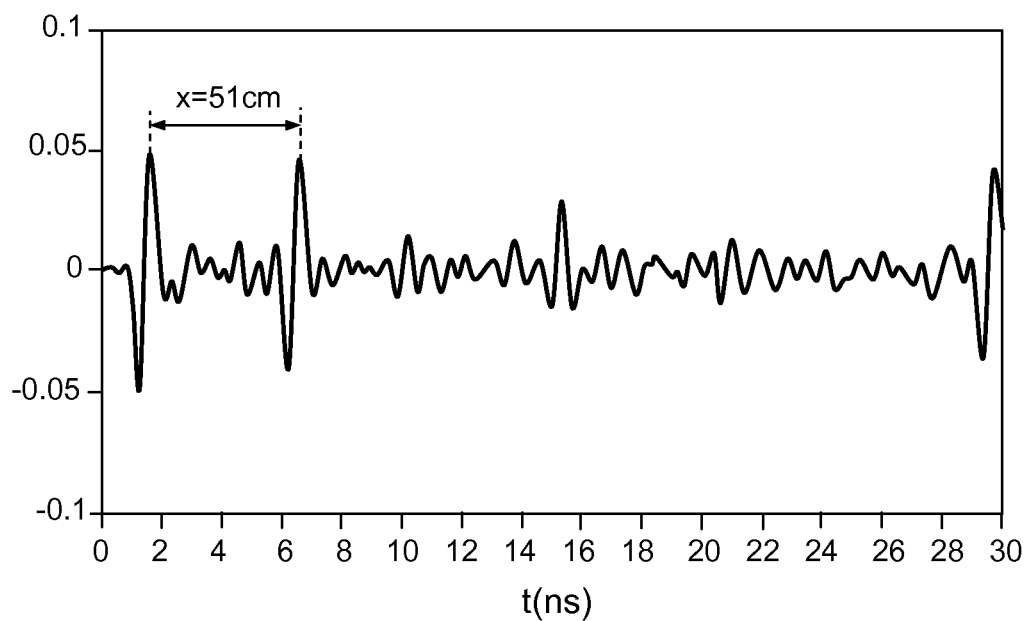
Figure 7:
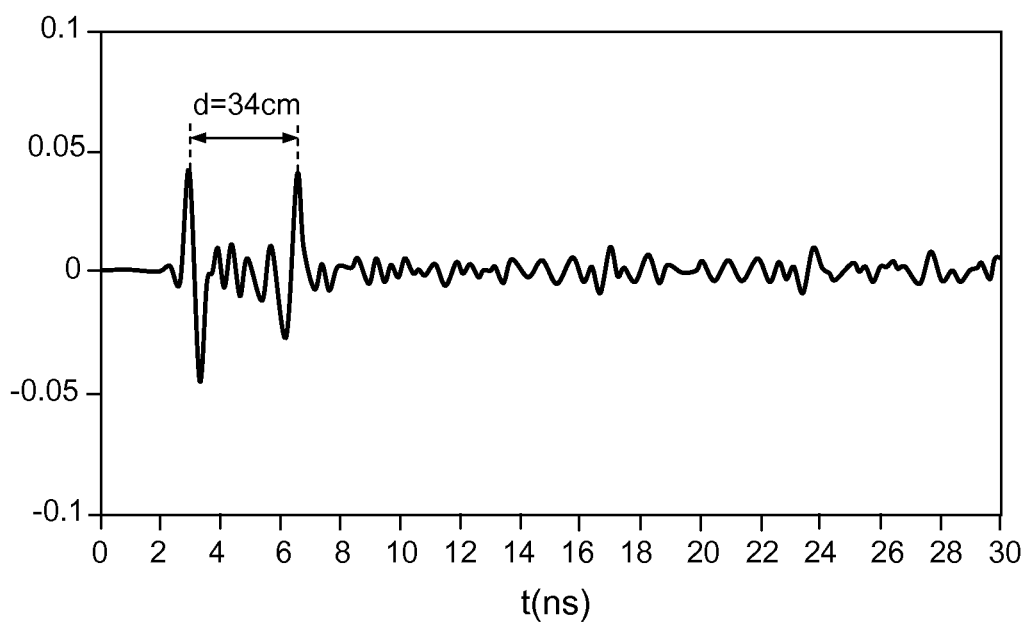

To overcome this problem and eliminate the disturbances linked to a fault affecting a specific area of the cable, it is advisable to subtract the reference reflectogram with that obtained after positioning the metal ring. As an example, FIG. 5 represents the reflectogram obtained after subtraction of the reference reflectogram for a metal ring positioned at a distance of 17 cm from the point of injection. In the case where this distance is not known, a second measurement is performed for which the ring is moved, the reflectogram obtained is illustrated in FIG. 6, for a position of the ring at 34 cm from its preceding position and at 51 cm from the point of injection. By performing the subtraction of the two reflectograms, the result illustrated in FIG. 7 is obtained which makes it possible, from the measurement of the delay observed between the first two amplitude peaks, to deduce therefrom the propagation velocity from just the knowledge of the distance d by which the ring has been moved between the two measurements. Thus, the positioning of the ring relative to the point of injection of the signal does not need to be known. This advantage is important for cables of very long length, for example network cables for which the operator can intervene at any point without necessarily having to measure the placement of the ring in relation to the end of the cable.

In the exemplary embodiments of the invention described above, the singularity created by the metal ring generates two successive amplitude peaks (a negative peak then a positive peak) on the reflectogram. Without departing from the framework of the invention, the means for artificially creating a singularity can provoke more complex local impedance variations in order to produce a signature making it possible to identify the section of cable tested in a unique manner and also more easily detect this signature when the signal-to-noise ratio is low. To generate such a signature, the above-mentioned means may consist of a ring alternating metal and insulator in its longitudinal direction. In such a case, the detection of the second amplitude peak 202 relative to the reflection on the artificial singularity is made by identification of the amplitude variation around this peak with the known signature.

In a variant embodiment of the invention, the method also relates to the measurement of the attenuation of the signal being propagated in the cable. From the information Γ giving the amplitude of the first peak and by measuring the amplitude Γ' of the last peak corresponding to the reflection of the signal on the end of the cable, the attenuation α in decibels undergone by the high-frequency signal in its propagation between the point of injection and the opposite end of the cable is determined using the following relationship:

$$\alpha = -20\log\sqrt{\frac{\Gamma'}{1-\Gamma^2}}.$$

To obtain a measurement of the attenuation of the signal by a unit of distance traveled, simply divide α by the length L of the cable which is also the distance between the point of injection of the signal and the end of the cable.

The present invention offers the advantage of making it possible to measure characteristics of an electrical cable in a non-intrusive manner. It also makes it possible to monitor the aging of a cable by monitoring the velocity measured over time.

The invention claimed is:

1. A method for measuring physical characteristics of a cable comprising:
   positioning, on said cable, an element configured to generate an artificial singularity at a position x,
   injecting, with a signal injector, an electrical test signal, at a point of injection of the cable,
   determining, with a measurement device, a first measure of a first reflection of the electrical test signal reflected on singularities of the cable, the first measure being called a first reflectogram,
   shifting, by an operator, the element configured to generate an artificial singularity by a distance d on the cable and measuring said distance d,
   injecting, with the signal injector, the electrical test signal at the point of injection,
   determining, with a measurement device, a second measure of the signal reflected on the singularities of the cable, the second measure being called a second reflectogram,
   subtracting, with a processor, the first reflectogram and the second reflectogram in order to produce a third reflectogram,
   determining, with a processor, the temporal position $\Delta t$ between two peaks of highest amplitude of the third reflectogram, and
   determining, with a processor, a propagation velocity $v_p$ of the signal in the cable from the temporal position $\Delta t$ and from the distance d.

2. The measurement method of claim 1, wherein the temporal position $\Delta t$ is measured in relation to a first temporal peak of the first reflectogram and the position x is measured in relation to the point of injection.

3. The measurement method of claim 1, wherein said element that generates an artificial singularity comprises at least one of the following elements: a metal ring, a ferromagnetic loop, a cable-clamping tray or a ring consisting, in the longitudinal direction, of an alternation of metal and of insulator.

4. The measurement method of claim 1, comprising the processing, with a processor, of said reflectograms with an algorithm for increasing the signal-to-noise ratio.

5. The measurement method of claim 1, further comprising determining, with a processor, the length of the cable from the measurement of propagation velocity $v_p$ and from a delay $\Delta t'$ between the first and the last signal peaks of the first reflectogram.

6. The measurement method of claim 1, wherein said injected test signal is a temporal pulse or a signal with controlled spectral mask.

7. A measurement device for measuring physical characteristics of a cable comprising:
   a signal injector configured to inject a test signal at a point of said cable,
   an element that generates an artificial singularity positioned on said cable,
   a signal measurement device configured to measure the test signal reflected on the singularities of the cable so as to produce a first measure being called a first reflectogram and a second measure being called a second reflectogram, the second reflectogram being obtained after shifting by an operator the element that generates an artificial singularity by a distance d on the cable, and
   a postprocessor configured to post-process said reflected signal, said postprocessor configured to:
      subtract the first reflectogram and the second reflectogram in order to produce a third reflectogram,
      measure the temporal position $\Delta t$ between two peaks of highest amplitude of the third reflectogram, and
      determine, a propagation velocity $v_p$ of the signal in the cable from the temporal position $\Delta t$ and from the distance d.

8. The measurement device of claim 7, wherein the signal injector and the signal measurement device are jointly implemented by a waveform generator, an oscilloscope, a vector network analyzer, or an electronic circuit board.

9. The measurement device of claim 7 wherein said element that generates an artificial singularity positioned on said cable is one of the following: a metal ring, a ferromagnetic loop or a cable-clamping tray.

* * * * *